United States Patent
Choulis et al.

(10) Patent No.: US 8,101,941 B2
(45) Date of Patent: Jan. 24, 2012

(54) INTERFACE CONDITIONING TO IMPROVE EFFICIENCY AND LIFETIME OF ORGANIC ELECTROLUMINESCENCE DEVICES

(75) Inventors: Stelios A. Choulis, San Jose, CA (US); Mathew Mathai, Santa Clara, CA (US); Vi-En Choong, San Jose, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 845 days.

(21) Appl. No.: 11/236,176

(22) Filed: Sep. 26, 2005

(65) Prior Publication Data
US 2007/0069199 A1 Mar. 29, 2007

(51) Int. Cl.
*H01L 35/24* (2006.01)
(52) U.S. Cl. ............ 257/40; 257/79; 257/E51.001
(58) Field of Classification Search ............ 257/40, 257/79, E51.001
See application file for complete search history.

(56) References Cited

U.S. PATENT DOCUMENTS

| | | | |
|---|---|---|---|
| 5,677,545 A * | 10/1997 | Shi et al. ............ | 257/40 |
| 6,852,252 B2 | 2/2005 | Halas et al. | |
| 6,853,134 B2 | 2/2005 | Ueno et al. | |
| 6,946,319 B2 | 9/2005 | Stegamat et al. | |
| 2001/0000335 A1* | 4/2001 | Yamada et al. ......... | 438/1 |
| 2001/0033135 A1* | 10/2001 | Duggal et al. ......... | 313/506 |
| 2002/0038867 A1* | 4/2002 | Kobori et al. ......... | 257/40 |
| 2003/0003300 A1* | 1/2003 | Korgel et al. ......... | 428/402 |
| 2003/0111955 A1* | 6/2003 | McNulty et al. ......... | 313/504 |
| 2004/0217696 A1 | 11/2004 | Kim et al. | |
| 2005/0035346 A1 | 2/2005 | Bazan et al. | |
| 2005/0069726 A1 | 3/2005 | Douglas et al. | |
| 2005/0088078 A1 | 4/2005 | Tseng et al. | |
| 2005/0158523 A1 | 7/2005 | Gupta et al. | |
| 2005/0276993 A1 | 12/2005 | Sohn et al. | |
| 2006/0131569 A1* | 6/2006 | Choi et al. ............ | 257/40 |
| 2007/0077594 A1 | 4/2007 | Hikmet et al. | |
| 2011/0031474 A1 | 2/2011 | Bechtel et al. | |

FOREIGN PATENT DOCUMENTS

| | | |
|---|---|---|
| CN | 1612661 A | 5/2005 |
| JP | 2002-124387 | 4/2002 |
| JP | 2004-335438 | 11/2004 |
| JP | 2005-135920 | 5/2005 |
| WO | WO 2004/086823 | 10/2004 |
| WO | WO 2005/055330 | 6/2005 |

OTHER PUBLICATIONS

Seth Coe-Sullivan et al., "Tuning the performance of hybrid organic/inorganic quantum dot light-emitting devices", Sep. 2003, Organic Electronics, vol. 4, No. 2/3, pp. 123-130.
International Search Report and Written Opinion, International Application Serial No. PCT/EP2006/008975, Nov. 27, 2006, 12 pp.

(Continued)

*Primary Examiner* — Kenneth Parker
*Assistant Examiner* — Anthony Ho
(74) *Attorney, Agent, or Firm* — Fish & Richardson P.C.

(57) ABSTRACT

In at least one embodiment of the invention, an OLED device is disclosed in which the surface of one or more layers of the OLED are conditioned with metal nano-particles such that they are disposed along the interface between adjacent layers.

22 Claims, 3 Drawing Sheets

OTHER PUBLICATIONS

Notification of the First Office Action for Chinese Application Serial No. 200680035113.9, dated Oct. 16, 2009, 9 pages.

"Polymer/Gold Nanoparticle Nanocomposite Light-Emitting Diodes: Enhancement of Electroluminescence Stability and Quantum Efficiency of blue-Light-Emitting Polymers," by Jong Hyeok Park, et al.; American Chemical Society, Chem. Matter, vol. 16, No. 4, 2004; pp. 688-692.

Japanese Patent Office, "Translation of the Notification of Reasons of Refusal (type I office action)" Appl. No. 2008-532630, mailed on Jun. 2, 2011 (5 pages).

* cited by examiner

INTERFACE CONDITIONING TO IMPROVE EFFICIENCY AND LIFETIME OF ORGANIC ELECTROLUMINESCENCE DEVICES

BACKGROUND

An organic light emitting diode ("OLED") display or device is typically comprised of: a transparent anode on a substrate; a hole injection/transporting layer; a light emitting layer ("emissive layer"); and a cathode, where one or more of these layers are organic in nature. When a forward bias is applied, holes are injected from the anode into the hole injection/transporting, and the electrons are injected from the cathode into the emissive layer. Both carriers are then transported towards the opposite electrode and allowed to recombine with each other. The location of this recombination is called the recombination zone and due to the recombination, the emissive layer produces visible light.

There is some suggestion in a published patent application that incorporation of metal nano-particles within a polymer-based light emitting layer suppresses photo-oxidation and enhances luminous stability [Publication number US 2004/0217696 A1]. Yet another patent application suggests that acceleration of the radiative processes is achieved by incorporation of metal nano-particles within the hole transporting layer or within the light emitting layer of phosphorescence based OLEDs [Publication number US 2005/0035346]. The acceleration of the radiative processes is achieved by the interaction of the light emitting species with surface plasmon resonances in the vicinity of metal nano-particles. Non-radiative Förster-type processes are efficiently suppressed by encasing each nano-particle in organic capping molecules. In all of the above approaches, metal nano-particles were blended in one or more layers of the OLEDs.

However direct incorporation of metal nano-particles into the active region or other layers within the OLED can cause additional negative effects. For example, it has been demonstrated that incorporation of a gold nano-particle even at low volume fraction of $3\times10^{-5}$ within a light emitting polymer layer introduces strong hole blocking effects and a large increase in operating voltage [Publication number US 2004/0217696 A1 and Jong Hyeok Park et al., Chem. Mater. 2004, 16, 688]. Furthermore, incorporation of metal nano-particles in both fluorescence-based and phosphorescence-based OLEDs will likely quench emission and strongly deteriorate device performance. Encasing nano-particles in organic capping molecules is suggested to achieve an optimum balance between quenching and acceleration of the radiative processes of the triplets states [Publication number US 2005/0035346]. However achieving such a condition is not straightforward and capping of the metal nano-particles is not a well known procedure.

DETAILED DESCRIPTION

Figure 1:
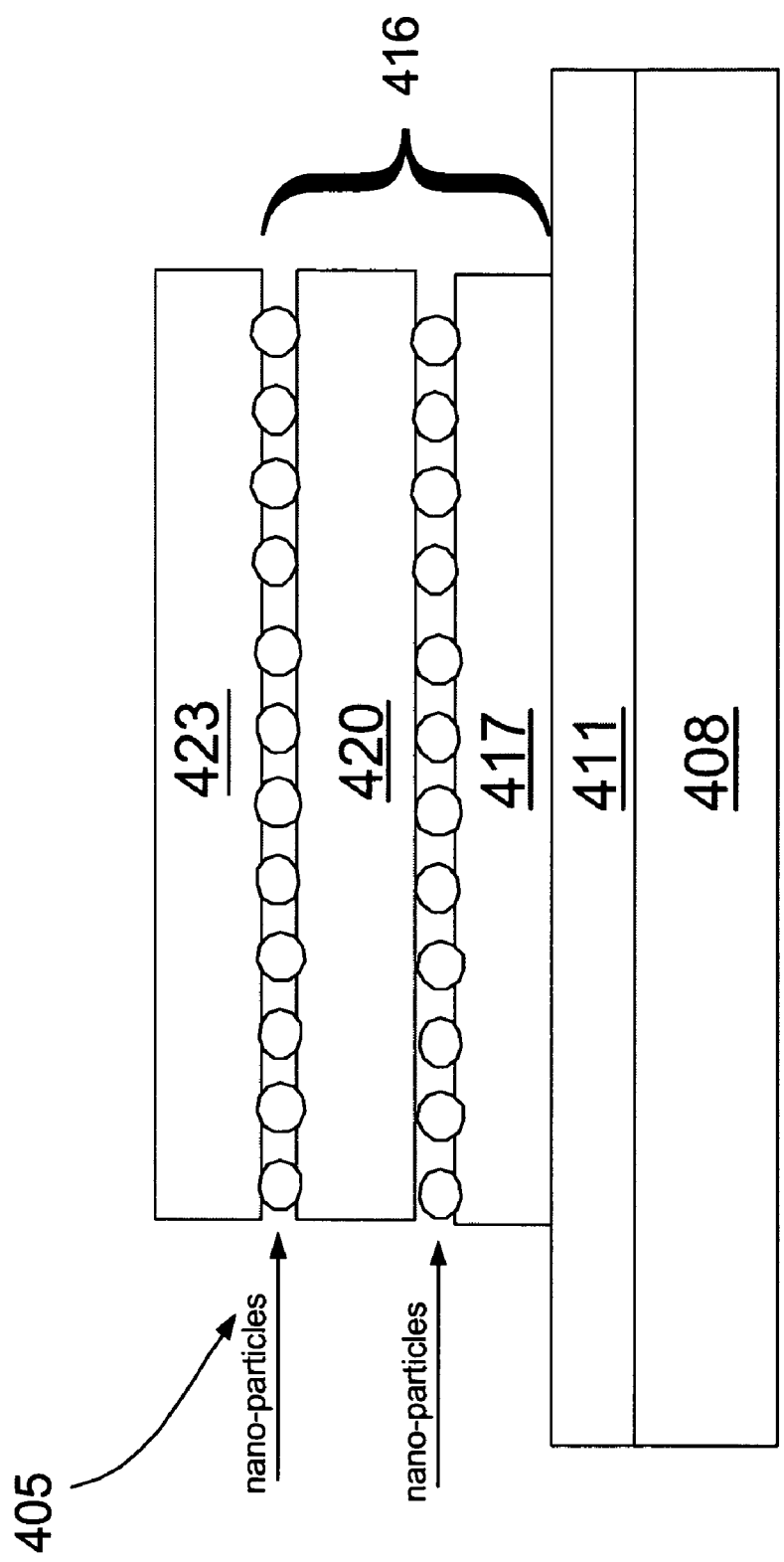
FIG. 1 shows a cross-sectional view of an embodiment of an EL device 405 according to at least one embodiment of the invention.

In at least one embodiment of the invention, an OLED device is disclosed in which the surface of one or more layers of the OLED are conditioned with metal nano-particles such that they are disposed along the interface between adjacent layers.

The various embodiments of the invention are directed toward designing organic light sources in order to obtain high efficiency and prolong the lifetime. This can be achieved by incorporation of at least one metal nano-particle in at least one interface between adjacent layers of the OLED device. The advantage of this approach is that the negative effects such as a strong increase in the operating voltage or quenching of emission properties of the OLED that is caused by direct blending the metal nano-particles within layers of the OLED (such as within the light emitting layer) are avoided. The present invention also improves the lifetime of organic electroluminescence devices not only by improving the efficiency but also by reducing the lifetime of the singlet and triplet states which can cause degradation mechanics in fluorescence and phosphorescence based OLEDs. In fluorescence based OLEDs the lifetime is likely to be improved by the accelerating of the lifetime or quenching some of the triplet states (triplets states are not emissive in fluorescence based OLEDs). OLEDs with phosphorescence-based emitters can achieve emission from both singlet and triplet excited states; hence the reason they have the possibility of yielding highly efficient OLEDs. In the case of phosphorescence based OLEDs since there is a mixture of singlet and triplet excitation states, it is believed that incorporation of nano-particles will improve lifetime by accelerating the lifetime of the mixture between singlet and triplets.

With regard to improving efficiency, it is believed that acceleration of radiative emission improves emission properties. To improve the efficiency of fluorescence based OLEDs, the device could accelerate the radiative emission which is coming from the singlets, which is sometimes difficult. In the case of phosphorescence based OLEDs, the radiative emission is coming from the mixture of singlet and triplet states, thus the radiative emission timescales are longer and nano-particles can be used to accelerate radiative emission as shown in one exemplary embodiment of the invention presented herein.

The additional relative steps in conditioning the layer surfaces with the metal nano-particles is extremely easy and can be applied not only to polymer or solution processed OLEDs but also to small molecule (thermally evaporated) OLEDs or to hybrids device structures (fabricating by methods include both solution processed and thermal evaporation techniques). Further, improvement in efficiency can be obtained without additional capping of the metal nano-particles. This simplifies not only the choice of nano-particles which can be used but also removes the need to fabricate metal nano-particles with capping layers.

The nano-particles used in accordance with the invention should have strong absorption in the visible or infrared range of spectrum. In accordance with the nano-particles will ideally have a resonance or at least an overlap with the triplet exciton states (the energy levels) of the organic material in the layers being interfaced.

For a given type of nano-particle, the absorption spectrum can be tuned as desired by modifying the size of the nano-particles or designing a nano-particle having a core over which the nano-particle material acts as a shell. For instance, gold nano-particles can be redesigned by using a silica core and plating the gold over the shell. The resonance of the absorption spectrum would depend in part upon the ratio of the dimensions of the core and shell and could be finely tuned by modifying this ratio.

FIG. 1 shows a cross-sectional view of an embodiment of an EL (electro-luminescent) device 405 according to at least one embodiment of the invention. The EL device 405 may represent one pixel or sub-pixel of a larger display or a portion of a non-pixilated lighting source. As shown in FIG. 1, the EL device 405 includes a first electrode 411 on a substrate 408. As used within the specification and the claims, the term "on" includes when layers are in physical contact or when layers are separated by one or more intervening layers or material. The first electrode 411 may be patterned for pixilated applications or remain un-patterned for light source applications.

One or more organic materials are deposited to form one or more organic layers of an organic stack 416. The organic stack 416 is on the first electrode 411. The organic stack 416 includes an anode buffer layer ("ABL") 417 and emissive layer (EML) 420. The ABL 417 is on the first electrode 411 when it functions as an anode. The OLED device 405 also includes a second electrode 423 on the organic stack 416. In accordance with at least one embodiment of the invention, at least one nano-particle can be disposed in the interfaces between various layers of the OLED device 405. Examples of such nano-particles include Ag, Au, Ni, Fe, Co, Ge, Cu, Pt, Pd, Os and the like. For instance, in at least one embodiment, nano-particles may be disposed between ABL 417 and EML 420. Alternatively, in at least one embodiment, nano-particles may be disposed between EML 420 and second electrode 423. In still other embodiments, nano-particles may be disposed between EML 420 and second electrode 423 and between ABL 417 and EML 420. In various embodiments, nano-particles can be disposed between any or all of the mentioned layers and in layers not specifically enumerated or disclosed.

Other layers than that shown in FIG. 1 may also be present in OLED device 405 such as charge confinement, charge transport/injection, charge blocking, exciton blocking, and wave-guiding layers. In accordance with the invention, at least one nano-particle can be disposed in the interfaces between these other layers and/or layers illustrated in FIG. 1.

Substrate 408:

The substrate 408 can be any material that can support the organic and metallic layers on it. The substrate 408 can be transparent or opaque (e.g., the opaque substrate is used in top-emitting devices). By modifying or filtering the wavelength of light which can pass through the substrate 408, the color of light emitted by the device can be changed. The substrate 408 can be comprised of glass, quartz, silicon, plastic, or stainless steel; preferably, the substrate 408 is comprised of thin, flexible glass. The preferred thickness of the substrate 408 depends on the material used and on the application of the device. The substrate 408 can be in the form of a sheet or continuous film. The continuous film can be used, for example, for roll-to-roll manufacturing processes which are particularly suited for plastic, metal, and metallized plastic foils. The substrate can also have transistors or other switching elements built in to control the operation if OLED device 405 is an active-matrix OLED device. A single substrate 408 is typically used to construct a larger display containing many pixels (EL devices) such as EL device 405 repetitively fabricated and arranged in some specific pattern.

First Electrode 411:

In one configuration, the first electrode 411 functions as an anode (the anode is a conductive layer which serves as a hole-injecting layer and which comprises a material with work function typically greater than about 4.5 eV). Typical anode materials include metals (such as platinum, gold, palladium, and the like); metal oxides (such as lead oxide, tin oxide, ITO (Indium Tin Oxide), and the like); graphite; doped inorganic semiconductors (such as silicon, germanium, gallium arsenide, and the like); and doped conducting polymers (such as polyaniline, polypyrrole, polythiophene, and the like).

The first electrode 411 can be transparent, semi-transparent, or opaque to the wavelength of light generated within the device. The thickness of the first electrode 411 can be from about 10 nm to about 1000 nm, preferably, from about 50 nm to about 200 nm, and more preferably, is about 100 nm. The first electrode layer 411 can typically be fabricated using any of the techniques known in the art for deposition of thin films, including, for example, vacuum evaporation, sputtering, electron beam deposition, or chemical vapor deposition.

ABL 417:

The ABL 417 has good hole conducting properties and is used to effectively inject holes from the first electrode 411 to the EML 420 (via the HT interlayer 418, see below). The ABL 417 is made of polymers or small molecule materials. For example, the ABL 417 can be made of tertiary amine or carbazole derivatives both in their small molecule or their polymer form, conducting polyaniline ("PANI"), or PEDOT:PSS (a solution of poly(3,4-ethylenedioxythiophene) ("PEDOT") and polystyrenesulfonic acid ("PSS") available as Baytron P from HC Starck). The ABL 417 can have a thickness from about 5 nm to about 1000 nm, and is conventionally used from about 50 to about 250 nm.

Other examples of the ABL 417 include any small molecule materials and the like such as plasma polymerized fluorocarbon films (CFx) with preferred thicknesses between 0.3 and 3 nm, copper phthalocyanine (CuPc) films with preferred thicknesses between 10 and 50 nm.

The ABL 417 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. A hole transporting and/or buffer material is deposited on the first electrode 411 and then allowed to dry into a film. The dried film represents the ABL 417. Other deposition methods for the ABL 417 include plasma polymerization (for CFx layers), vacuum deposition, or vapor phase deposition (e.g. for films of CuPc).

In accordance with at least one embodiment of the invention, the exposed surface, the surface of ABL 417 adjacent to the EML 420 is treated with nano-particles. The nano-particles used in accordance with the invention should have strong absorption in the visible or infrared range of spectrum. In accordance with the nano-particles will ideally have a resonance or at least an overlap with the triplet exciton states (the energy levels) of the organic material in the layers being interfaced.

The nano-particles may be metallic in nature and may comprise, for instance, Ag, Au, Ni, Fe, Co, Ge, Cu, Pt, Pd, Os, Ti and the like or may be oxides or compounds of such metals (e.g. TiO2). The nano-particles may also be non-metallic such as silicon dioxide and so on. For a given type of nano-particle, the absorption spectrum can be tuned as desired by modifying the size of the nano-particles or designing a nano-particle having a core over which the nano-particle material acts as a shell. For instance, gold nano-particles can be redesigned by using a silica core and plating the gold over the shell. The resonance of the absorption spectrum would depend in part upon the ratio of the dimensions of the core and shell and could be finely tuned by modifying this ratio. Further, improvement in efficiency can be obtained without additional capping of the metal nano-particles. This simplifies not only the choice of nano-particles which can be used but also removes the need to fabricate metal nano-particles with capping layers.

The steps in conditioning the layer surfaces with the metal nano-particles is extremely easy and can be applied not only to polymer or solution processed OLEDs but also to small molecule (thermally evaporated) OLEDs or to hybrids device structures (fabricating by methods include both solution processed and thermal evaporation techniques). The nano-particles may be deposited by sputtering, evaporation, spin coating, spray coating, dipping, and so on and may result in an ultra-thin "layer" of nano-particles being formed in the interface between the ABL 417 and the EML 420. Nano-particles can range in size from 0.01 nm to 10 nm and can be solution processed (e.g. spin coated onto the surface of the ABL 417 using nano-particles dissolved in a solution or suspension (for instance dissolved in toluene). Typical concentrations of the nano-particles are in the range of 0.01 to 10 weight percent but can be as high as 50 weight percent.

EML 420:

For organic LEDs (OLEDs) as the EL device 405, the EML 420 contains at least one organic material that emits light. These organic light emitting materials generally fall into two categories. The first category of OLEDs, referred to as polymeric light emitting diodes, or PLEDs, utilize polymers as part of EML 420. The polymers may be organic or organo-metallic in nature. As used herein, the term organic also includes organo-metallic materials. Light-emission in these materials may be generated as a result of fluorescence and/or phosphorescence. For phosphorescence, the EML 420 can include any triplet emitter compound such as iridium complexes, lanthanide complexes, organic triplet emitters, porphyrins, and osmium complexes. For fluorescence, EML 420 can include singlet emitters such as organic dyes, conjugated polymers conjugated oligomers and small molecules.

The light emitting organic polymers in the EML 420 can be, for example, EL polymers having a conjugated repeating unit, in particular EL polymers in which neighboring repeating units are bonded in a conjugated manner, such as polythiophenes, polyphenylenes, polythiophenevinylenes, or poly-p-phenylenevinylenes or their families, copolymers, derivatives, or mixtures thereof. More specifically, organic polymers can be, for example: polyfluorenes; poly-p-phenylenevinylenes that emit white, red, blue, yellow, or green light and are 2-, or 2,5-substituted poly-p-pheneylenevinylenes; polyspiro polymers. Preferably, these polymers are solvated in an organic solvent, such as toluene or xylene, and spun (spin-coated) onto the device, although other deposition methods are possible too.

In addition to polymers, smaller organic molecules that emit by fluorescence or by phosphorescence can serve as a light emitting material residing in EML 420. Unlike polymeric materials that are applied as solutions or suspensions, small-molecule light emitting materials are preferably deposited through evaporative, sublimation, or organic vapor phase deposition methods. There are also small molecule materials that can be applied by solution methods too. Combinations of PLED materials and smaller organic molecules can also serve as active electronic layer. For example, a PLED may be chemically derivatized with a small organic molecule or simply mixed with a small organic molecule to form EML 420. Examples of electroluminescent small molecule materials include tris (8-hydroxyquinolate) aluminum ($Alq_3$), anthracene, rubrene, tris(2-phenylpyridine) iridium (Ir(ppy)$_3$), triazine, any metal-chelate compounds and derivatives of any of these materials.

In addition to active electronic materials that emit light, EML 420 can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, triphenylamine, and triphenyldiamine. EML 420 may also include semiconductors, such as silicon, gallium arsenide, cadmium selenide, or cadmium sulfide.

In accordance with at least one embodiment of the invention, the exposed surface, the surface of EML 420 which is adjacent to the second electrode 423 is treated with nano-particles. The nano-particles used in accordance with the invention should have strong absorption in the visible or infrared range of spectrum. In accordance with the nano-particles will ideally have a resonance or at least an overlap with the triplet exciton states (the energy levels) of the organic material in the layers being interfaced.

The nano-particles may be metallic in nature and may comprise, for instance, Ag, Au, Ni, Fe, Co, Ge, Cu, Pt, Pd, Os, Ti and the like or may be oxides or compounds of such metals (e.g. $TiO2$). The nano-particles may also be non-metallic such as silicon dioxide and so on. For a given type of nano-particle, the absorption spectrum can be tuned as desired by modifying the size of the nano-particles or designing a nano-particle having a core over which the nano-particle material acts as a shell. For instance, gold nano-particles can be redesigned by using a silica core and plating the gold over the shell. The resonance of the absorption spectrum would depend in part upon the ratio of the dimensions of the core and shell and could be finely tuned by modifying this ratio. Further, improvement in efficiency can be obtained without additional capping of the metal nano-particles. This simplifies not only the choice of nano-particles which can be used but also removes the need to fabricate metal nano-particles with capping layers.

The steps in conditioning the layer surfaces with the metal nano-particles is extremely easy and can be applied not only to polymer or solution processed OLEDs but also to small molecule (thermally evaporated) OLEDs or to hybrids device structures (fabricating by methods include both solution processed and thermal evaporation techniques). The nano-particles may be deposited by sputtering, evaporation, spin coating, spray coating, dipping, and so on and may result in an ultra-thin "layer" of nano-particles being formed in the interface between the EML 420 and the second electrode 423. Nano-particles can range in size from 0.01 nm to 10 nm and can be solution processed (e.g. spin coated onto the surface of the EML 420 using nano-particles dissolved in a solution or suspension (for instance dissolved in toluene). Typical concentrations of the nano-particles are in the range of 0.01 to 10 weight percent but can be as high as 50 weight percent.

All of the organic layers such as ABL 417 and EML 420 can be ink-jet printed by depositing an organic solution or by spin-coating, or other deposition techniques. This organic solution may be any "fluid" or deformable mass capable of flowing under pressure and may include solutions, inks, pastes, emulsions, dispersions and so on. The liquid may also contain or be supplemented by further substances which affect the viscosity, contact angle, thickening, affinity, drying, dilution and so on of the deposited drops. Further, any or all of the layers 417 and 420 may be cross-linked or otherwise physically or chemically hardened as desired for stability and maintenance of certain surface properties desirable for deposition of subsequent layers. Alternatively, if small molecule materials are used instead of polymers, the ABL 417, and the EML 420 can be deposited through evaporation, sublimation, organic vapor phase deposition, or in combination with other deposition techniques.

Second Electrode (423)

In one embodiment, second electrode 423 functions as a cathode when an electric potential is applied across the first electrode 411 and the second electrode 423. In this embodiment, when an electric potential is applied across the first electrode 411, which serves as the anode, and second electrode 423, which serves as the cathode, photons are released from active electronic layer 420 and pass through first electrode 411 and substrate 408.

While many materials, which can function as a cathode, are known to those of skill in the art, most preferably a composition that includes aluminum, indium, silver, gold, magnesium, calcium, lithium fluoride, cesium fluoride, sodium fluoride, and barium, or combinations thereof, or alloys thereof, is utilized. Aluminum, aluminum alloys, and combinations of magnesium and silver or their alloys can also be utilized. In some embodiments of the invention, a second electrode 423 is fabricated by thermally evaporating in a three layer or combined fashion lithium fluoride, calcium and aluminum in various amounts.

Preferably, the total thickness of second electrode 423 is from about 10 to about 1000 nanometers (nm), more preferably from about 50 to about 500 nm, and most preferably from about 100 to about 300 nm. While many methods are known to those of ordinary skill in the art by which the first electrode material may be deposited, vacuum deposition methods, such as physical vapor deposition (PVD) are preferred.

Often other processes such as washing and neutralization of films, addition of masks and photo-resists may precede cathode deposition. However, these are not specifically enumerated as they do not relate specifically to the novel aspects of the invention. Other fabrication processes like adding metal lines to connect the anode lines to power sources may also be desirable. Other layers (not shown) such as a barrier layer and/or getter layer and/or other encapsulation scheme may also be used to protect the electronic device. Such other processing steps and layers are well-known in the art and are not specifically discussed herein.

Figure 2:
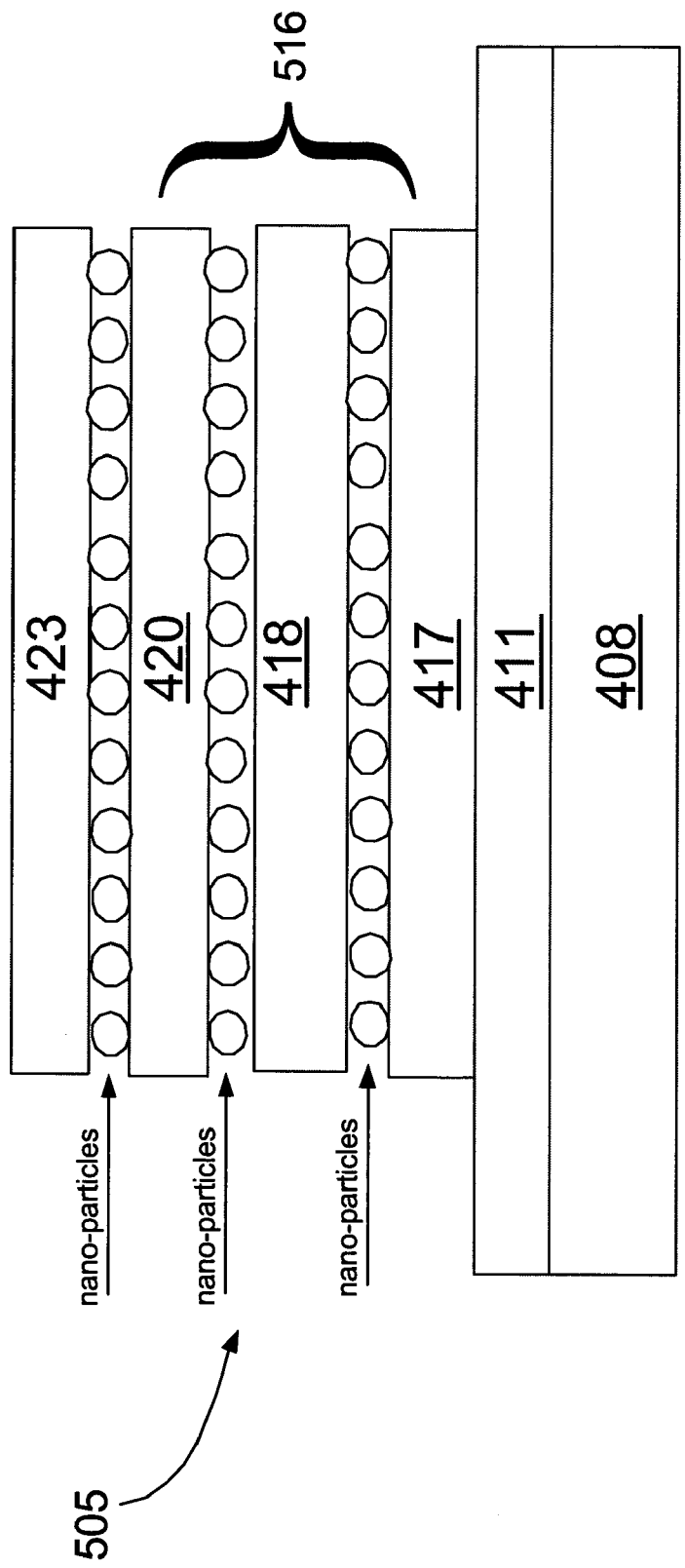
FIG. 2 shows a cross-sectional view of an embodiment of an EL device 505 according to at least a second embodiment of the invention.

FIG. 2 shows a cross-sectional view of an embodiment of an EL device 505 according to at least a second embodiment of the invention. Like numbered elements in devices 405 and 505 have a similar description with, as given above, and will not be repeated. The device 505 is identical in most aspects to device 405 of FIG. 1 except for the following. Device 505 has an organic stack 516 which includes an additional HT interlayer 418.

HT Interlayer 418:

The functions of the HT interlayer 418 are among the following: to assist injection of holes into the EML 420, reduce exciton quenching at the anode, provide better hole transport than electron transport, and block electrons from getting into the ABL 417 and degrading it. Some materials may have one or two of the desired properties listed, but the effectiveness of the material as an interlayer is believed to improve with the number of these properties exhibited. Through careful selection of the hole transporting material, an efficient interlayer material can be found. The HT interlayer 418 is fabricated from a hole transporting material that may consist at least partially of or may derive from one or more following compounds, their derivatives, moieties, etc: polyfluorene derivatives, poly(2,7-(9,9-di-n-octylfluorene)-(1,4-phenylene-((4-secbutylphenyl)imino)-1,4-phenylene) and derivatives which include cross-linkable forms, non-emitting forms of poly(p-phenylenevinylene), triarylamine type material (e.g. triphenyldiamine (TPD), α-napthylphenyl-biphenyl (NPB)), thiopene, oxetane-functionalized polymers and small molecules etc. In some embodiments of the invention, the HT interlayer 418 is fabricated using a cross-linkable hole transporting polymer. The HT interlayer 418 may also comprise one or more emissive components such as phosphorescent dopants, polymers and so on.

The HT interlayer 418 can be ink-jet printed by depositing an organic solution, by spin-coating, by vacuum deposition, by vapor phase deposition, or other deposition techniques whether selective or non-selective. Further, if required, the HT interlayer 418 may be cross-linked or otherwise physically or chemically hardened as desired for stability and maintenance of certain surface properties desirable for deposition of subsequent layers.

In accordance with at least one embodiment of the invention, the exposed surface, the surface of HT interlayer 418 which is adjacent to the EML 420 is treated with nano-particles. The nano-particles used in accordance with the invention should have strong absorption in the visible or infrared range of spectrum. In accordance with the nano-particles will ideally have a resonance or at least an overlap with the triplet exciton states (the energy levels) of the organic material in the layers being interfaced.

The nano-particles may be metallic in nature and may comprise, for instance, Ag, Au, Ni, Fe, Co, Ge, Cu, Pt, Pd, Os, Ti and the like or may be oxides or compounds of such metals (e.g. TiO2). The nano-particles may also be non-metallic such as silicon dioxide and so on. For a given type of nano-particle, the absorption spectrum can be tuned as desired by modifying the size of the nano-particles or designing a nano-particle having a core over which the nano-particle material acts as a shell. For instance, gold nano-particles can be redesigned by using a silica core and plating the gold over the shell. The resonance of the absorption spectrum would depend in part upon the ratio of the dimensions of the core and shell and could be finely tuned by modifying this ratio. Further, improvement in efficiency can be obtained without additional capping of the metal nano-particles. This simplifies not only the choice of nano-particles which can be used but also removes the need to fabricate metal nano-particles with capping layers.

The steps in conditioning the layer surfaces with the metal nano-particles is extremely easy and can be applied not only to polymer or solution processed OLEDs but also to small molecule (thermally evaporated) OLEDs or to hybrids device structures (fabricating by methods include both solution processed and thermal evaporation techniques). The nano-particles may be deposited by sputtering, evaporation, spin coating, spray coating, dipping, and so on and may result in an ultra-thin "layer" of nano-particles being formed in the interface between the HT interlayer 418 and the EML 420. Nano-particles can range in size from 0.01 nm to 10 nm and can be solution processed (e.g. spin coated onto the surface of the HT interlayer 418 using nano-particles dissolved in a solution or suspension (for instance dissolved in toluene). Typical concentrations of the nano-particles are in the range of 0.01 to 10 weight percent but can be as high as 50 weight percent.

In the embodiment shown in FIG. 2, the ABL 417 would no longer be adjacent to the EML 420 due to the addition of an interlayer. Thus, the description of the ABL 417 given above would be modified in that an additional interface that can optionally incorporate nano-particles is between the ABL 417 and the HT interlayer 418 as described above. The HT interlayer 418 should thus be substituted for the EML 420 in the above FIG. 1 discussion of the ABL 417.

EXAMPLE

Figure 3B:
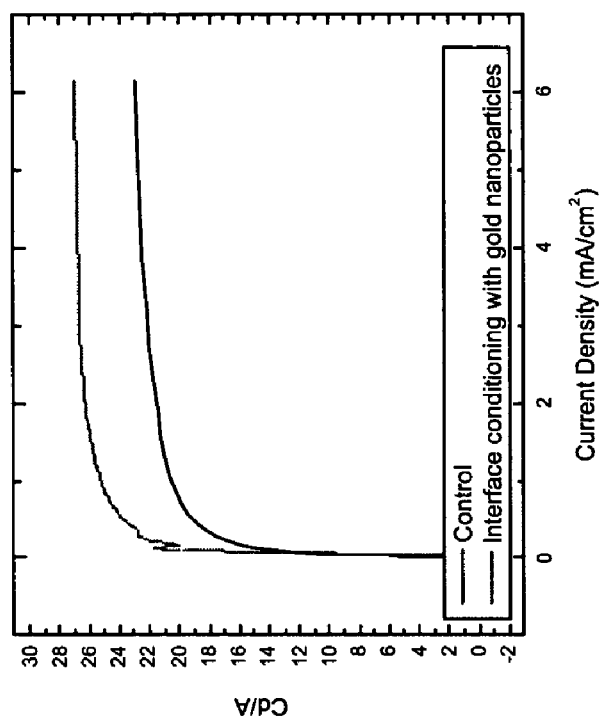
FIGS. 3A-3B compare the device characteristics of a phosphorescence OLED with and without the application of surface conditioning with metal nano-particles.
Figure 3A:
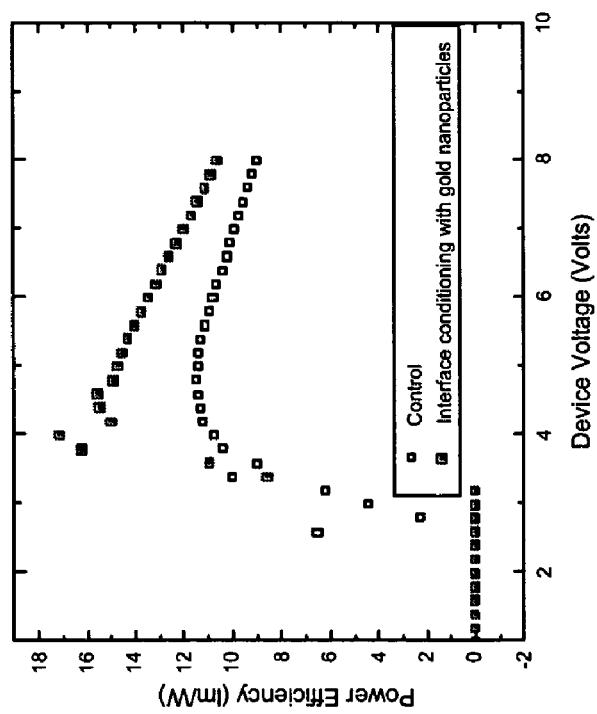

As an example, the invention was utilized in a phosphorescence-based OLED. FIGS. 3A-3B compare the device characteristics of a phosphorescence OLED with and without the application of surface conditioning with metal nano-particles. A control device was based on the following architecture: Anode consisting of ITO/ABL consisting of PEDOT:PSS (trade name AI4083)/EML/Cathode consisting of CsF followed by Al. To increase the efficiency of the device, in accordance with the invention, in a second device, the surface of the PEDOT:PSS (i.e. the ABL) layer was conditioned with gold nano-particles. In the surface-treated device all other layers remained identical to the control device. The EML is all devices comprises of tris(2-4(4-toltyl)phenylpyridine)iridium ("Ir(mppy)$_3$") using a non conjugated poly(N-vinylcarbazole) (PVK) as a host molecularly doped with N,N'-diphenyl-N—N'-(bis(3-methylphenyl)-[1,1-biphenyl]-4-4'-diamine (TPD) and 2-(4-biphenylyl)-5-(4-tert-butylphenyl)-1,3,4-oxadiazole (PBD). The EML for all the devices studied contains 61% PVK+24% PBD+9% TPD+6% Ir(mppy)$_3$ in concentrations given by weight percent. Gold nano-particles were dissolved in a toluene solution with the gold nano-particles ranging in size from 1 to 10 nm. The surface of the PEDOT:PSS layer was then conditioned by spin coating the gold nano-particle solution in toluene upon it.

FIGS. 3A-3B compare the device characteristics of a phosphorescence OLED with and without the application of surface conditioning with metal nano-particles. FIG. 3A illustrates the power efficiency of both of the above described devices. The power efficiency or luminance efficacy (as measured in 1 m/W) of the second device, the device conditioned with gold nano-particles, is about 30-35% greater than the control device. FIG. 3B illustrates the luminance efficiency of both of the above described devices. In general, the luminance efficiency of the second device, the device conditioned with gold nano-particles, is about 20-25% greater than the control device as measured in Cd/A. The efficiency of the device improves, it is believed, by the acceleration of radiative emission caused by incorporation of gold nano-particles in the interface between the PEDOT:PSS and phosphorescence-based EML, thus improving emission properties.

As any person of ordinary skill in the art of electronic device fabrication will recognize from the description, figures, and examples that modifications and changes can be made to the embodiments of the invention without departing from the scope of the invention defined by the following claims.

The invention claimed is:

1. An electroluminescent device, comprising:
an anode layer;
a cathode layer; and
a stack of layers between said anode layer and said cathode layer, said stack of layers including at least one layer comprising organic material, wherein nano-particles are disposed in at least one interface between layers in said stack of layers or between said stack of layers and said cathode layer, the nano-particles being confined to the interface, the nano-particles not being mixed throughout any of the layers defining the interface wherein the nano-particles are disposed, wherein any layer within the stack of layers includes at least one small molecule material having not more than five linear repeating units.

2. An electroluminescent device, comprising:
an anode layer;
a cathode layer; and
a stack of layers between said anode layer and said cathode layer, said stack of layers including at least one layer comprising organic material, wherein nano-particles are disposed in at least one interface between layers in said stack of layers or between said stack of layers and said cathode layer, the nano-particles being confined to the interface, the nano-particles not being mixed throughout any of the layers defining the interface wherein the nano-particles are disposed, wherein the stack of layers includes an electroluminescent layer and at least one small molecule material in the electroluminescent layer, the small molecule material being one of tris(8-hydroxyquinolate) aluminum, anthracene, rubrene, tris(2-phenylpyridine) iridium, triazine, or any metal-chelate compound or derivative thereof.

3. The device according to claim 2 wherein said stack of layers includes at least one of:
an anode buffer layer disposed over said anode layer;
an emissive layer, said emissive layer capable of emitting light; and
a hole transporting interlayer.

4. The device according to claim 3 wherein said emissive layer comprises a conjugated poly-p-phenylenevinylene polymer.

5. The device according to claim 3 wherein said emissive layer comprises a conjugated polyspiro polymer.

6. The device according to claim 3 wherein said emissive layer comprises a conjugated fluorene polymer.

7. The device according to claim 2 wherein at least one of said layers in said stack of layers comprises a light emissive component.

8. The device according to claim 7 wherein said light emissive component comprises at least one phosphorescence-based emitter.

9. The device according to claim 7 wherein said light emissive component comprises at least one fluorescence-based emitter.

10. The device according to claim 7 wherein said light emissive component comprises at least one phosphorescence-based emitter and at least one fluorescence-based emitter.

11. The device according to claim 2 wherein any layer within said stack of layers is formed at least in part using at least one polymer organic material.

12. The device according to claim 2 wherein said nano-particles comprise at least one of Ag, Au, Ni, Fe, Co, Ge, Cu, Pt, Pd, Os, Ti, Si or compounds thereof.

13. The device according to claim 2 wherein said nano-particles are disposed by at least one of sputtering, spin coating, spray coating, or thermal evaporation.

14. The device according to claim 2 wherein said nano-particles form an ultra-thin layer of nano-particles upon being disposed.

15. The device according to claim 2 wherein each of said nano-particles has a size ranging from 0.01 to 10 nanometers.

16. The device according to claim 2 wherein said nano-particles comprise a core of a first material and a shell of a second different material.

17. The device according to claim 16 wherein said first material is silica.

18. The device according to claim 17 wherein said second material comprises at least one of Ag, Au, Ni, Fe, Co, Ge, Cu, Pt, Pd, Os, Ti, Si or compounds thereof.

19. The device of claim 2 wherein said nano-particles have an absorption spectrum which overlaps the triplet exciton state of the material in either one of the layers defining the interface wherein said nano-particles are disposed.

20. The device of claim 19 wherein said nano-particles have a resonance with the triplet exciton state of the material in either one of the layers defining the interface wherein said nano-particles are disposed.

21. The device of claim 2 wherein the nano-particles are in more than one interface between adjacent layers in the stack of layers or in an interface between adjacent layers in the stack of layers and between the stack of layers and the cathode layer.

22. The device of claim 2 wherein the stack of layers includes an electroluminescent layer and the at least one small molecule material in the electroluminescent layer is one of tris(8-hydroxyquinolate) aluminum, anthracene, rubrene, tris(2-phenylpyridine) iridium, triazine, or any metal-chelate compound or derivative thereof.

* * * * *